United States Patent [19]
Kato et al.

[11] Patent Number: 5,474,644
[45] Date of Patent: Dec. 12, 1995

[54] METHOD AND APPARATUS FOR HIGH-FLATNESS ETCHING OF WAFER

[75] Inventors: Tadahiro Kato; Hideo Kudo, both of Fukushima, Japan

[73] Assignee: Shin-Etsu Handotai Co., Ltd., Tokyo, Japan

[21] Appl. No.: 278,132

[22] Filed: Jul. 21, 1994

[30]    Foreign Application Priority Data

Jul. 30, 1993  [JP]  Japan .................................. 5-208961

[51] Int. Cl.$^6$ ...................................... B05C 5/00
[52] U.S. Cl. ..................... 156/345; 156/639.1; 216/88; 216/91
[58] Field of Search ........................... 156/639.1, 640.1, 156/636.1, 345; 134/33, 149, 153, 198, 902; 216/88, 91

[56]              References Cited
           U.S. PATENT DOCUMENTS 5,019,205   5/1991   Endl et al. ........................ 156/345

FOREIGN PATENT DOCUMENTS 0169541   7/1984   European Pat. Off. ......... H01L 21/68
3820591   6/1988   Germany ...................... H01L 21/306

OTHER PUBLICATIONS

IBM Technical Disclosure Bulletin, V.6,N.4 pp. 5–6; Electropolishing Semiconductor Wafers, Sep. 1963.

Primary Examiner—Thi Dang
Attorney, Agent, or Firm—Ronald R. Snider

[57]              ABSTRACT

A method and an apparatus for high-flatness etching a semiconductor single crystal wafer wherein said wafer is so rotated in a flow of an etchant radially spreading in a plane that the main surface of said wafer may move parallelly with the flow of said etchant.

4 Claims, 7 Drawing Sheets

FLOW OF ETCHANT

FLOW OF ETCHANT

METHOD AND APPARATUS FOR HIGH-FLATNESS ETCHING OF WAFER

BACKGROUND OF THE INVENTION

1. Field of the Invention

This invention relates to a method and an apparatus for etching uniformly the surface of a semiconductor single crystal wafer (hereinafter referred to simply as "wafer") obtained by slicing a semiconductor single crystal rod such as silicon and then lapping the opposite surfaces of each wafer resulting from the slicing to impart to the wafer an etched surface of high flatness.

2. Description of the Prior Art

The chemical etching of wafer is utilized for the purpose of (1) removing from the surface of a wafer a deformed layer produced by such machining works as slicing and lapping, (2) allowing visual observation of crystal defects, and (3) microprocessing a wafer by selective etching, for example. The present invention is aimed to accomplish the purpose of (1) mentioned above.

The conventional method used for etching of wafer consists in etching a given wafer by rotating the wafer in the flow of etchant caused as by bubbling and enabling the etchant in motion to come into contact with the surface of the wafer. In this case, the rotation of the wafer is intended to flatten the wafer surface as much as possible by abating the possibility that the reaction gas arising during the etching treatment will impart streaks or random undulation to the wafer surface.

Incidentally, in the etching treatment, the desirability of decreasing the inconstancy of etching depth at various parts of the wafer or improvement the flatness of wafer surface is never fulfilled unless the relative average flow rate of the etchant and the wafer with which the etchant contacts is uniformized as much as possible at various parts of the wafer.

The conventional method mentioned above, however, it is difficult to control the flow rate of the etchant, so it fails to uniform the etching depth of the wafer surface and to obtain a chemically etched wafer having high flatness.

In the etching treatment, the etchant first contacts on the outer edge part of the wafer and then flows parallelly with the main surface of the wafer to the central part of the wafer. The relative average flow rate of the etchant and the wafer is locally varied in the outer edge part mentioned above. As a result, the etching treatment tends to become incomplete particularly in the edge part. FIG. 9 is intended to depict the state of incomplete etching.

When the etchant flows in the direction of the arrow B while the wafer W is kept rotating,or not rotating as shown in the upper part of FIG. 9, the flow rate varies at the edge part as mentioned above and a locally abnormal shape 101 occurs in the edge part of the wafer W as shown in the lower part of FIG. 9. Since this abnormal shaping also affects the neighboring region of the wafer, the wafer W is not uniformly etched and therefore is prevented from acquiring a flat surface. FIG. 9 illustrates the abnormal shape on a magnified scale. In the diagram, the vertical axis represents the scale of thickness of the wafer W and the horizontal axis the scale of distance in the radial direction.

SUMMARY OF THE INVENTION

This invention, produced in the light of the true state of the prior art described above, has for an object thereof the provision of a method and an apparatus simple in construction and capable of producing a chemically etched wafer possessing high flatness by uniformizing to the fullest possible extent the average relative flow rate of etchant and a wafer under treatment thereby decreasing the inconstancy of etching depth of the wafer surface and abating the possibility of an undulation on the wafer surface caused by the reaction gas.

The first aspect of this invention is a method for high-flatness etching of a semiconductor single crystal wafer, which is characterized in that the wafer is so rotated in a flow of an etchant radially spreading in a plane that the main surface of the wafer may move parallelly with the flow of the etchant.

The second aspect of this invention is an apparatus for high-flatness etching of a wafer comprising an etching tank and an absorbing and rotating device for absorbing and rotating a wafer, the etching tank provided with two disk-like plate (hereinafter referred to simply as "plate") formed flatly either wholly or except for the central part thereof and coaxially opposed in the vertical direction across a suitable space as laid parallelly or substantially parallelly with each other, an etchant supply part formed at the central part of either of the plates, an etchant outlet formed of the gap between the peripheral edge parts of the plates, and an etchant flow path formed by the space intervening between the opposed surfaces of the plates, and an opening part formed at a suitable position on at least one of the plates except for the central part thereof, the absorbing and rotating device has the wafer absorbing surface of the absorbing part thereof is disposed to confront the etchant flow path via the opening part parallelly with the plate.

An apparatus set forth in the third aspect of this invention is derived from the apparatus of the second aspect of this invention and characterized in that the central part of the plate provided with the etchant supply part is formed in a flared shape and the central part of the other plate is formed in a shape conically or hemispherically projecting toward the flared part.

An apparatus set forth in the fourth aspect of this invention is derived from the apparatus of the second or third aspect of this invention and characterized in that the opening part is provided only on the upper side plate and the absorbing and rotating device is disposed movably in the vertical direction directly above the opening part so that the opening part may be sealed against liquid leakage by the mutual contact between the absorbing and rotating device and the opening part.

An apparatus set forth in the fifth aspect of this invention is derived from the apparatus of any of claims the second, third and fourth aspect of this invention and characterized in that an annular template is disposed concentrically around the outer periphery of the absorbing and rotating device so that the surface of the template may be caused by the contact of the absorbing part of the absorbing and rotating device with the opening part to protrude toward the etchant flow path from the surface of a wafer being etched in the absorbed state or to lie in one and the same plane as the surface of the wafer being etched in the absorbed state.

BRIEF DESCRIPTION OF THE DRAWINGS

The invention will be better understood and the objects and features thereof other than those set forth above will become apparent when consideration is given to the following detailed description thereof, which makes reference to the annexed drawings wherein.

DETAILED DESCRIPTION OF THE INVENTION

Figure 1:
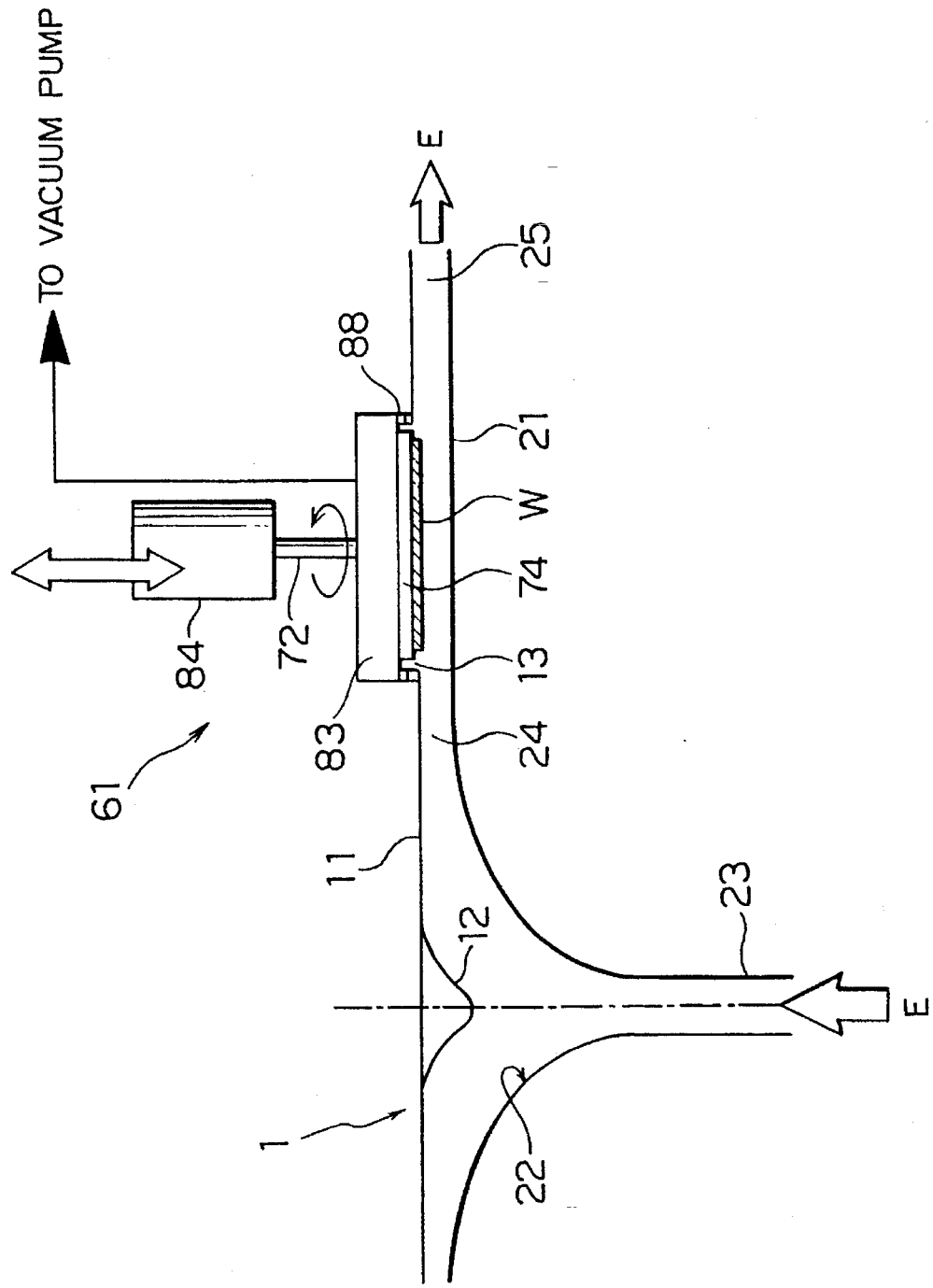
FIG. 1 is a schematic cross section illustrating the essential part of one example of the apparatus of this invention.

The method of etching according to the first aspect of this invention is characterized in that the flow of etchant is generated in a planarily radial form. The flow velocity v of the etchant in the proximity of a wafer under treatment is represented by the following formula (1):

$$v=b-ar \qquad (1)$$

wherein a and b independently stand for a positive constant and r stands for the distance in the radial direction from the center of an etching tank. The formula (1) indicates that the etchant flow velocity v decreases in accordance with the distance from the center of the etching tank increase.

By placing a wafer rotating at a specific rotational rate in this flow of the etchant, the relative speed distribution within the wafer surface is rendered uniform enough to permit production of a chemically etched wafer of high flatness.

In the apparatus for etching according to the second aspect of this invention, for example, the absorbing and rotating device is lowered to bring the lower end part of the device into contact with the opening part formed on the upper side plate of the etching tank after a wafer has been fixed at the absorbing part. As a result, the wafer is allowed to confront the etchant flow path via the opening part parallelly with the plate mentioned above.

The etchant emanating from the etchant supply part flows in a substantially vertical direction into the etching tank, forms a horizontal current, and continues to flow past the etchant flow path while spreading in a planarily radial pattern. Since the surface of the rotating wafer parallelly contacts with the flow of the etchant mentioned above, the etching action by the method of etching set forth in the first aspect of this invention is consequently obtained.

In this case, it is important that the two vertically opposed plates ("top plate" and "bottom plate" as will be referred to afterward) should have the shape thereof and the manner of disposition thereof (such as the space intervening between the opposed surfaces of the plates) set so that the flow velocity distribution of the etchant within the wafer surface may satisfy the aforementioned formula (1). The uniformization of the relative average flow velocity (time average flow velocity) throughout the entire wafer surface can be accomplished by combining a specific rotational rate of the wafer in the etching tank incorporating therein such plates as mentioned above with the flow velocity of the etchant appropriate for the rotational rate.

In the apparatus for etching according to the third aspect of this invention, the etchant flow is rectified and meantime uniformly dispersed in a planarily radial pattern with virtually no pressure loss by the flow path which is formed by the confrontation of the flared part and the conical or hemispherical projection.

In the apparatus for etching according to the fourth aspect of this invention, since the opening part is enabled to form a seal against leakage, of liquid, the etchant flow path for the etching tank can be formed and, at the same time, the etchant flowing through this etchant flow path can be prevented from leaking through the opening part.

In the apparatus for etching according to the fifth aspect of this invention, since the etchant flow in the proximity of the wafer is rectified by the template, the otherwise possible occurrence of an abnormal shape in the edge part of the wafer can be curbed.

Now, the present invention will be described below more 7 specifically with respect to working examples illustrated in the annexed drawings.

Figure 2:
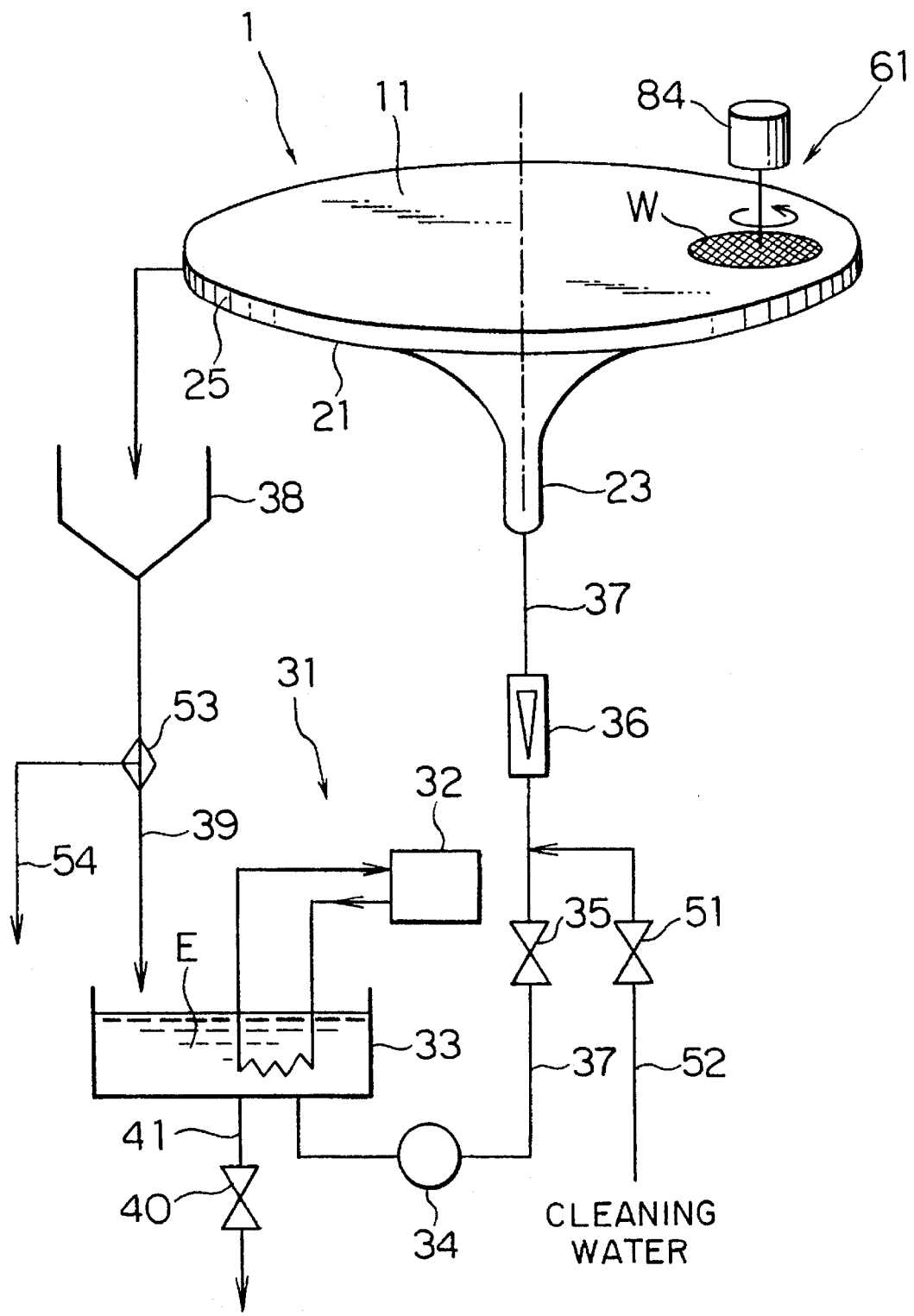
FIG. 2 is a schematic perspective view illustrating the construction of an etching tank in the example of FIG. 1.
Figure 3:
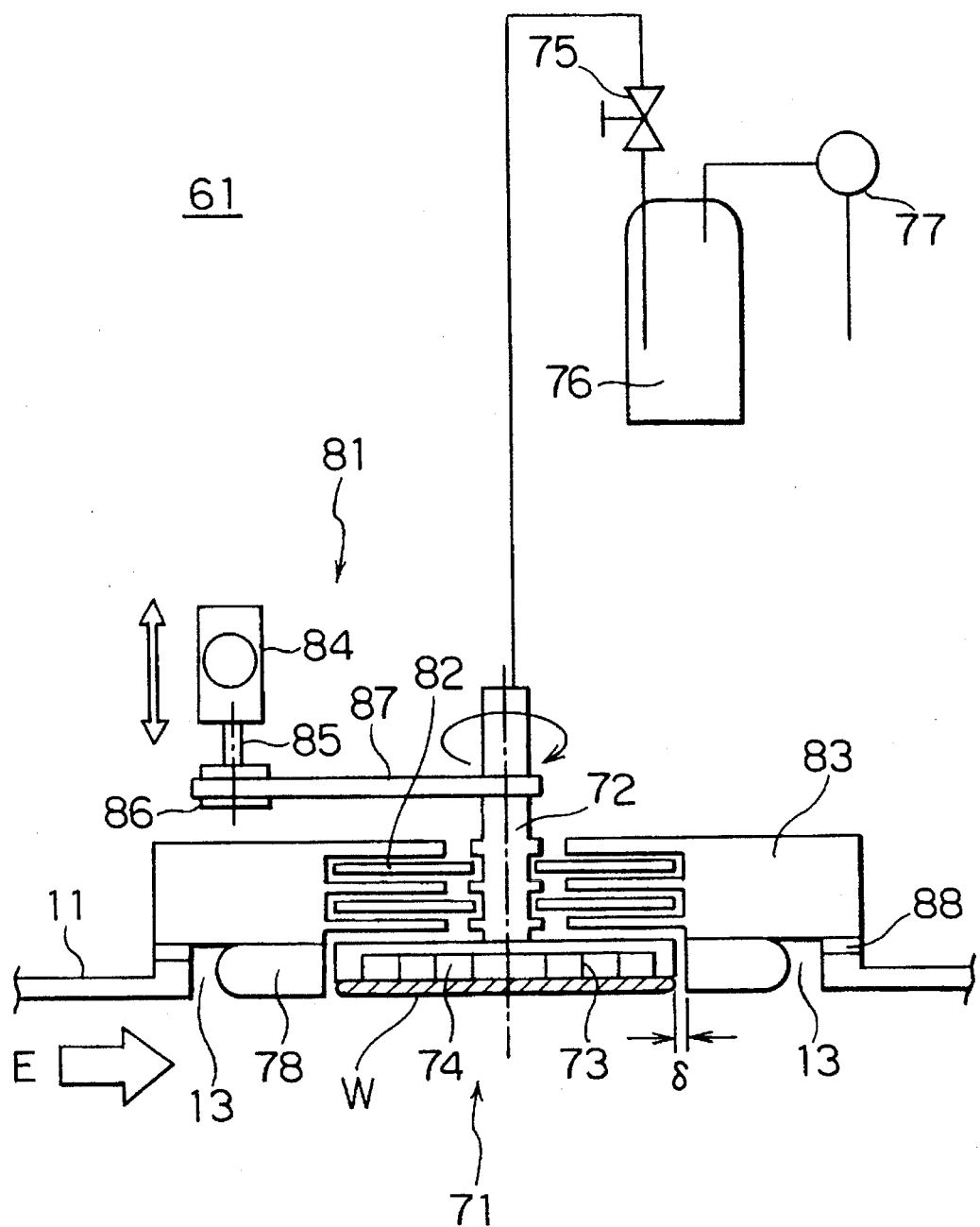
FIG. 3 is a cross section of an absorbing and rotating device in the example of FIG. 1.
Figure 4:
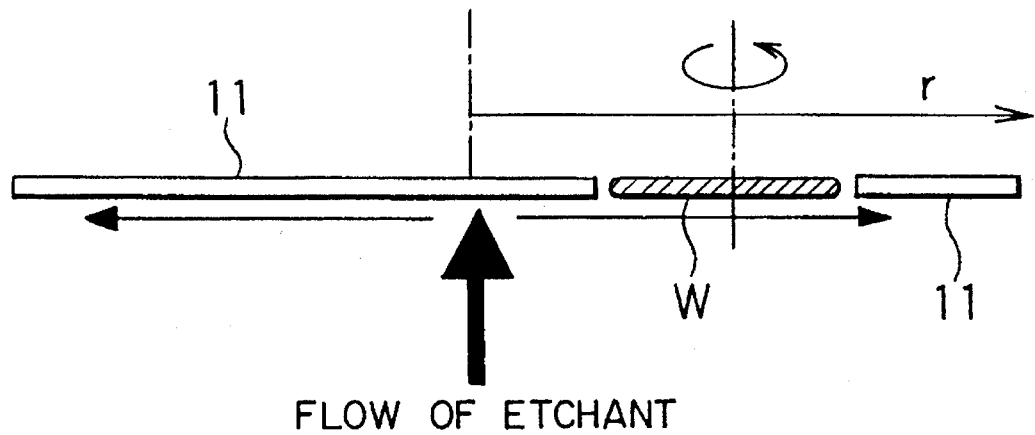
FIG. 4 is an explanatory cross section illustrating the action of the example of FIG. 1.
Figure 5:
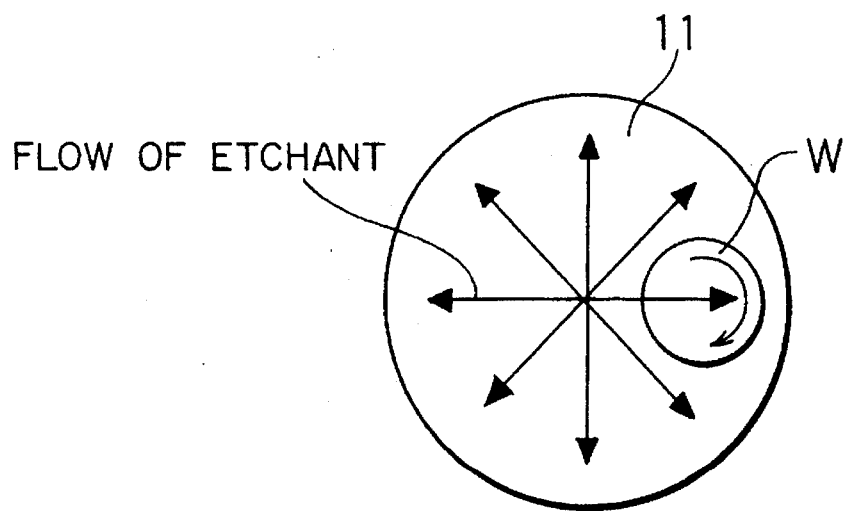
FIG. 5 is an explanatory plan view illustrating the action of the example of FIG. 1.

Example 1:

FIG. 1 is an explanatory sectioned diagram illustrating the essential part of an etching apparatus, FIG. 2 is a schematic perspective view of an etching tank, FIG. 3 is a cross section of an absorbing and rotating device, FIG. 4 is an explanatory sectioned diagram of the action of the etching apparatus, and FIG. 5 is an explanatory plan view illustrating the action. The etching apparatus is composed of an etching tank 1 and an absorbing and rotating device 61.

The etching tank 1 is constructed by causing a disclike top plate 11 having a conical (or hemispherical) projection 12 formed in the central part of a flat circular plate and a circular opening part 13 formed at a flat position of the circular plate avoiding the projection 12 and a disclike bottom plate 21 substantially equaling the top plate in diameter and having a flared part 22 formed in the central part and an etchant supply part 23 formed in the lower part of the flared part 22 and a flat part formed in the peripheral part except for the flared part 22 to be coaxially opposed in the vertical direction as laid parallelly (or substantially parallelly) across a suitable space (with the top plate 11 disposed on the upper side) as illustrated in FIG. 1 and FIG. 2. Then, an etchant flow path 24 is formed in the space intervening between the opposed surfaces of the top plate 11 and the bottom plate 21 and, at the same time, an etchant outlet 25 is formed of the annular gap occurring between the peripheral edge parts of these plates.

The generatrix of the conical projection 12 forms a depressed curve. Optionally, a right conical projection which has a rectilinear generatrix, a hemispherical projection, or a projection which has a shape similar thereto may be used in the place of the conical projection 12. By having this projection 12 opposed to the flared part 22, the action of rectifying and dispersing the etchant can be obtained.

The absorbing and rotating device 61 which is intended to absorb (with vacuum) and rotate a wafer W is disposed directly above the opening part 13 of the etching tank 1 in such a manner as to be vertically moved with an elevating device not shown in the diagram. An annular seal member 88 disposed at the lower end of a cylindrical supporting member 83 (refer to FIG. 3 for further detail) adapted to support a rotary shaft 72 driven with a motor 84 is caused to collide with the opening part 13 to seal the opening part 13 and, at the same time, allow the wafer W in the absorbed state to confront the etchant flow path 24 via the opening part 13 parallelly with the bottom plate 21.

An etchant supply device 31 for supplying the etchant to the etching tank 1 is constructed as shown in FIG. 2. The etchant supply part 23 mentioned above is connected to an etchant storage tank 33 provided with a temperature control device 32 via an etchant supply pipe 37 which is provided with a circulating pump 34, a switch valve 35, and a flow meter 36. Directly below the etching tank 1 is disposed a funnel 38 (which, though illustrated in a size smaller than the size of the etching tank 1 for the convenience of illustration, actually has a larger diameter than the etching tank 1 as described hereinbelow). The bottom part of this funnel 38 is connected to the etchant storage tank 33 through the medium of an etchant recovery tank 39 which is provided with a three-way valve 53. The three-way vale 53 is also connected via a water discharge pipe 54 to a spent cleaning water storage tank which is not shown in the diagram. The funnel is given an inside diameter larger than a diameter of the etching tank 1 so as to ensure recovery of the whole volume of the etchant (or spent cleaning water) radially overflowing from the etchant outlet 25. To the etchant storage tank 33 is connected a drainpipe 41 which is provided with a switch valve 40.

The etchant supply device 31 mentioned above has annexed thereto a cleaning water supply device which is adapted to give a wash to the etched wafer within the etching tank 1. In this case, a cleaning water supply pipe 52 provided with a switch valve 51 is connected to the inlet side of the flow meter 36 of the etchant supply pipe 37. Optionally, the cleaning water supply device, the three-way valve 53, and the outlet pipe 54 may be omitted and the etched wafer may be cleaned with a washing device which is separately installed.

The construction of the absorbing and rotating device 61 is illustrated in detail in FIG. 3. This device is composed of an absorbing part 71 for absorbing and fixing the wafer W and a rotary drive part 81 for rotating the wafer. The absorbing part 71 is adapted to be integrally moved vertically with the rotary drive part 81.

First, the absorbing part 71 will be described. At the leading end part of the rotary shaft 72 which has an unshown absorbing hole perforated in the axial line therethrough and is adapted to serve concurrently as one element of the rotary drive part 81, a chucking plate 74 having numerous absorbing holes 73 formed therein is disposed perpendicularly thereto. These absorbing holes 73 communicate with the aforementioned absorbing hole of the rotary shaft 72 and, at the same time, allow the absorbing hole to be connected to a vacuum tank 76 via a switch valve 75 and further allow the vacuum tank 76 to be connected to a vacuum pump 77.

An annular template 78 is attached fast concentrically to the periphery of the chucking plate 74. In this case, the template 78 is attached fast to the lower end surface of the rotary shaft supporting member 83 so that the inner peripheral surface of the template 78 and the outer peripheral surface of the wafer W may define a gap 6 and, at the same time, the lower surface of the template 78 may assume a planar position substantially flush with the surface of the wafer W for etching.

To be specific, the lower surface of the template 78 assumes virtually the same planar position as the lower surface of the top plate 11 and protrudes toward the bottom plate 21 side from the surface of the chucking plate 74 for absorbing the wafer. As the result of this arrangement, the surface of the wafer for etching is allowed to assume the same planar position as the lower surface of the top plate 11 when the wafer is absorbed to the wafer absorbing surface. In this invention, the lower surface of the template 78 is allowed to protrude toward the etchant flow path side from the surface of the wafer W for etching.

The numerical value of the gap 6 mentioned above is to be 11 set experimentally or empirically. The rotary drive part 81 mentioned above has the rotary shaft 72 supported by the rotary shaft supporting member 83 through the medium of a shaft sealing member 82. A belt 87 is passed around an unshown pulley provided for the rotary shaft 72 and a pulley 86 provided for the drive shaft 85 of the motor 84. The seal member 88 for sealing the opening part 13 mentioned above is annularly disposed at the lower end of the rotary shaft supporting member 83.

Now, the action of this etching device will be explained below.

The vacuum pump 77 is set operating and the switch valve 75 is opened to attach the wafer W fast to the chucking plate 74 through evacuation. The absorbing and rotating device 71 is lowered with the unshown elevating device so as to allow the seal member 88 to come into tight contact with the upper surface of the opening 13 of the top plate 11, assume the state shown in FIG. 1 and FIG. 3, seal the opening part 13 against leakage of liquid (to prevent the etchant in the etchant flow path 24 from leaking through the opening 13 onto the upper surface side of the top plate 11) and, at the same time, enable the surface of the wafer W (for etching) and the planar position of the template 78 to coincide substantially with the lower surface of the top plate 11 as shown in FIG. 3.

Then, the motor 84 is actuated to rotate the wafer W and the circulating pump 34 is actuated to supply the etchant E to the etching tank 1 and induce etching of the wafer W.

In this case, the etchant E in the etchant storage tank 33 having the temperature thereof adjusted preparatorily to a stated level with the temperature control device 32 in the etchant storage tank 33 is supplied via the supply pipe 37 to the etching tank 1. The etchant E overflowing from the etching tank 1 is returned via the funnel to the etchant storage tank 33.

In the process of etching treatment mentioned above, the etchant E in the etchant flow path 24 of the etching tank 1 is dispersed and rectified by a guiding action generated by the flared part 22 and the conical (or hemispherical) projection 12 and the flow of the etchant E, after being bent perpendicularly to the horizontal direction, is spread in a planarily radial pattern parallelly (namely horizontally) with the top plate 11 in the part in which the top plate 11 and the bottom plate 21 are opposed parallelly with each other and is advanced toward the etchant outlet 25 as illustrated in FIGS. 1, 3, 4, and 5.

In this case, since the surfaces of the wafer W and the template 78 are set parallelly with the top plate 11 and in the same planar position, the wafer W is etched by the laminar flow of the etchant parallel with the surfaces mentioned above. By setting the rotational speed of the wafer W and the flow rate of the etchant at proper numerical values, the relative average flow rate of the etchant can be substantially uniformized at various portions of the wafer surface.

The flow rate of the etchant on the surface of the wafer W or in the vicinity thereof inside the etchant flow path 24 while the wafer W is not in rotation is expressed by the aforementioned formula (1). When a specific rotational rate is imparted to the water in the etchant flow, the relative average flow rate 13 distribution on the surface of the wafer W can be uniformized to the extent of ensuring infallible production of a chemically etched wafer of high flatness.

Figure 6:
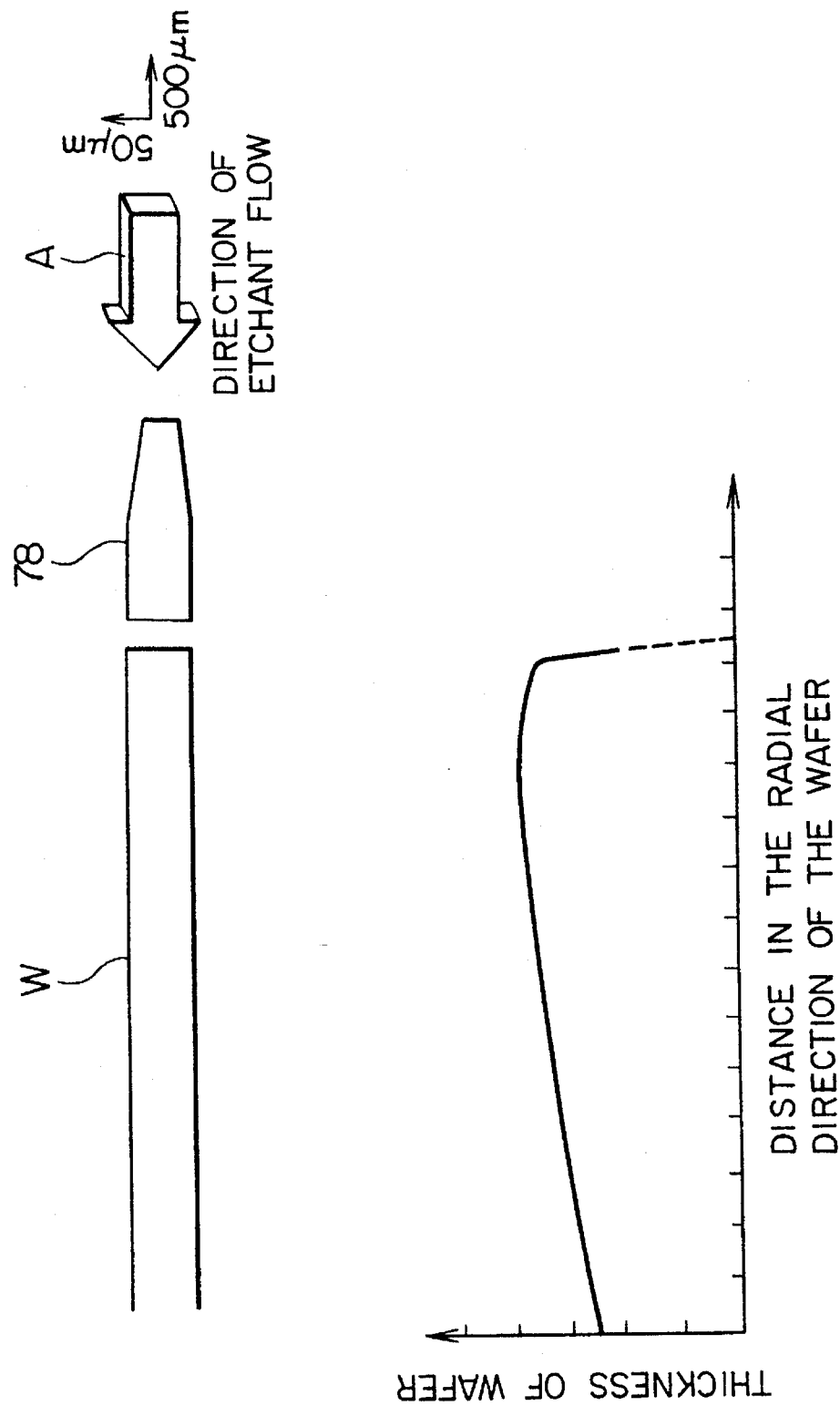
FIG. 6 is an explanatory diagram illustrating the effect of a template in the example of FIG. 1.
Figure 7:
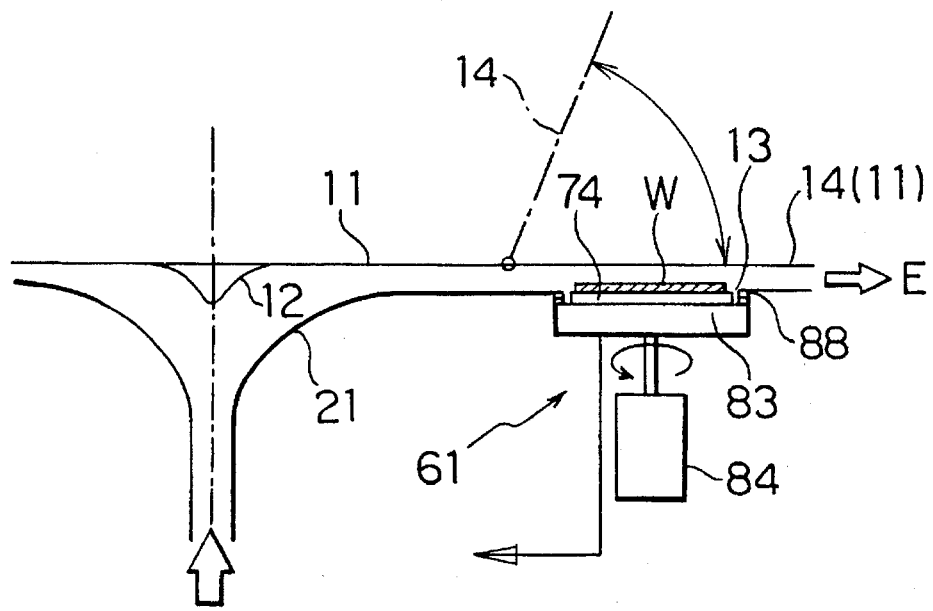
FIG. 7 is a schematic cross section illustrating the essential part of another example of the apparatus of the present invention.
Figure 9:
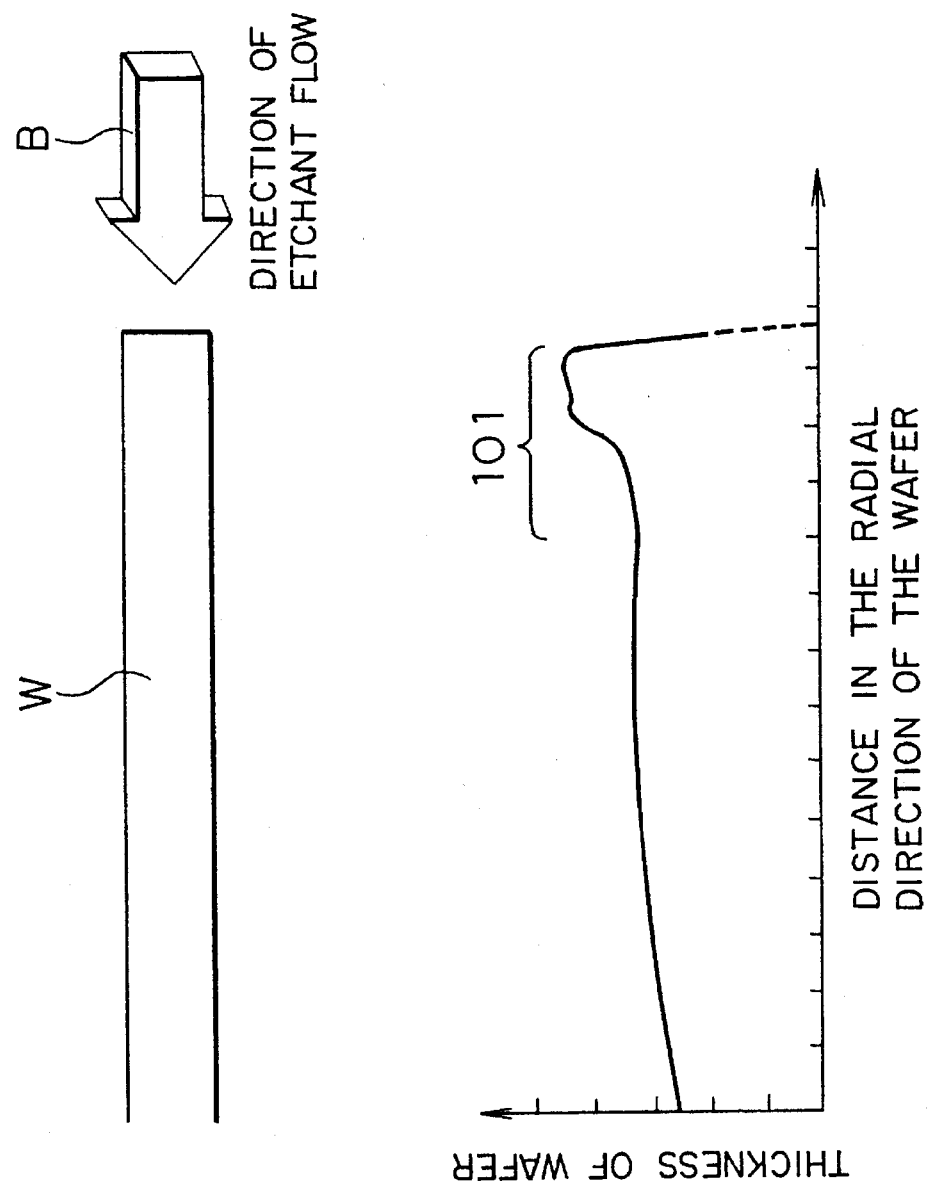
FIG. 9 is an explanatory diagram showing a problematic point of the conventional etching method.

Further, since the template 78 is disposed in the manner described above, the etchant flow in the direction of the arrow A is rectified with the template 78 as shown in the upper part of FIG. 6, with the result that the disturbance of the flow rate at the outer peripheral edge of the wafer W is diminished and the variation of the etching shape at the outer peripheral edge is alleviated. The lower part of FIG. 6 depicts the outcome of the rectification of the etchant flow. It clearly indicates that the abnormal shaping of the edge part is notably curbed as compared with that on the wafer shown in FIG. 9.

After the etching treatment has been completed, the wafer W is kept in the rotating state and the cleaning water is supplied to the etching tank 1 to give a wash to the wafer W. The spent washing water is recovered via the three-way valve 53 into the spent washing water storage tank not shown in the diagram.

After the washing is completed, the absorbing and rotating device 61 is elevated and the wafer W is detached from the chucking plate 74.

In the example described above, the top plate 11 is provided with the conical projection 12 and the bottom plate 21 has the central part of the leading end thereof formed in the flared shape. Optionally, the vertical relation of these plates 11 and 21 may be reversed and the etchant may be supplied downwardly to the etching tank 1. For the purpose of enabling the etchant to spread in a planarily radial pattern, it is important that these components should be disposed in a horizontal (or substantially horizontal) direction. In any event, they are only required to be so constructed that the etchant from the etchant supply pipe 37 may be rectified and meantime spread in a radial manner without inducing turbulence. For example, the top plate 11 and the bottom plate 21 may be wholly flat discs.

Further, in the example described above, the opening part 13 is formed in the top plate 11 and the absorbing and rotating device 61 is disposed in a vertically movable state. In the place of this construction, the opening part 13 may be formed in the bottom plate 21, the part of the top plate 11 directly above the opening part 13 may be formed as a crescentic open-shut lid 14 adapted to open on the central part side of the etching tank 1 and having a considerably larger size than the opening part 13, and the rotary shaft supporting member 83 may be kept in engagement with the opening part 13 through the medium of the seal member 88. In this case, the work of loading and unloading of the wafer may be carried out by opening and closing the open-shut lid 14. Optionally the elevating device for the absorbing and rotating device 61 may be omitted.

The example described above is designed to give the etching treatment to one wafer W at a time. When the apparatus is provided with a plurality of opening parts 13 and as many absorbing and rotating devices 61 as the opening parts 13, it is capable of performing the etching treatment on the plurality of wafers at a time.

Figure 8:
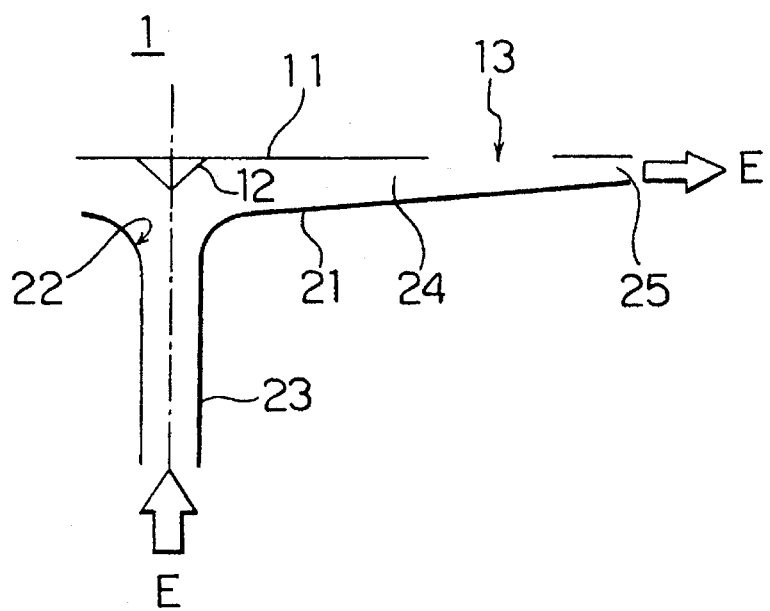
FIG. 8 is a schematic cross section illustrating the essential part of yet another example of the apparatus of the present invention.

The example described above has a fixed space interposed between the opposite surfaces of the top plate 11 and the bottom plate 21. This interposition of the fixed space is not an essential requirement for this invention. These plates, for example, may be so disposed that the interposed space between the opposed surfaces thereof may gradually decrease from the upstream to the downstream side of the etchant flow path as illustrated in FIG. 8. In this case, a flow of an etchant radially spreading in a plane as in the example described above.

As clearly noted from the description given above, the method for etching set forth in claim 1 permits uniformization of the relative average flow rate (time average relative flow rate) throughout the entire wafer surface and abatement of the inconstancy of etching depth of the wafer surface owing to the combination of a proper revolution number of the wafer with a proper etchant flow rate and allows alleviation of the undulation of the wafer surface due to the passage of the reaction gas on account of the rotation of the wafer. Thus, it brings about an effect of enabling a chemically etched wafer of high flatness to be produced by a simple and convenient procedure.

The apparatus for etching set forth in claim 2 realizes the etching effect aimed at by the method for etching set forth in claim 1 because the etchant flowing into the etching tank flows horizontally and meanwhile spreads in a planarily radial pattern and keeps advancing through the etchant flow path and because the surface of the rotating wafer comes into contact parallelly with the flow of the etchant. The apparatus is simple in construction and, therefore, can be offered at a low cost.

The apparatus for etching set forth in claim 3 enables a chemically etched wafer having a far higher degree of flatness 16 than is obtained by the method for etching set forth in claim 1 because the flow path formed by the opposition of the flared part and the conical or hemispherical projection enables the etchant flow to be rectified and, at the same time, dispersed uniformly in a planarily radiant pattern with virtually no pressure loss.

The apparatus for etching set forth in claim 4 brings about an effect of furnishing the etchant flow path for the etching tank and, at the same time, preventing the flowing etchant from leaking through the opening part, precluding loss of the etchant and protecting the work environment against deterioration with the etchant.

The apparatus for etching set forth in claim 5 produces an effect of precluding the occurrence of an abnormal shape at the outer peripheral end of the wafer because the template serves the purpose of rectifying the etchant flow near the wafer.

What is claimed is:

1. An apparatus for high-flatness etching of a wafer characterized by comprising an etching tank and an absorbing and rotating device for absorbing and rotating a wafer, said etching tank provided with two disclike plates formed flatly either wholly or except for the central part thereof and coaxially opposed in the vertical direction across a suitable space as laid parallelly or substantially parallelly with each other, an etchant supply part formed at the central part of either of said plates, an etchant outlet formed of the gap between the peripheral edge parts of said plates, and an etchant flow path formed by said space intervening between the opposed surfaces of said plates, and an opening part formed at a suitable position on at least one of said plates except for the central part thereof, said absorbing and rotating device has the wafer absorbing surface of the absorbing part thereof disposed to confront said etchant flow path via said opening part parallelly with said plates.

2. An apparatus according to claim 1, wherein the central part of said plate provided with said etchant supply part is formed in a flared shape and the central part of the other plate is formed in a shape conically or hemispherically projecting toward said flared part.

3. An apparatus according to claim 2, wherein said opening part is provided only on the upper side plate and said absorbing and rotating device is disposed movably in the vertical direction directly above said opening part so that said opening part may be sealed against liquid leakage by the mutual contact between said absorbing and rotating device and said opening part.

4. An apparatus according to claim 1, wherein an annular template is disposed around the outer periphery of said absorbing part of said absorbing and rotating device concentrically with said absorbing part so that the surface of said template may be caused by the contact of said absorbing and rotating device with said opening part to protrude toward said etchant flow path from the surface of a wafer being etched in the absorbed state or to lie in one and the same plane as the surface of said wafer being etched in the absorbed state.

* * * * *